(12) United States Patent
Kwon et al.

(10) Patent No.: US 7,956,343 B2
(45) Date of Patent: Jun. 7, 2011

(54) NONVOLATILE MEMORY DEVICES AND METHOD OF MANUFACTURING THE SAME

(75) Inventors: Yong-wook Kwon, Yongin-si (KR); Chul-soon Kwon, Seoul (KR); Young-cheon Jeong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 497 days.

(21) Appl. No.: 12/010,921

(22) Filed: Jan. 31, 2008

(65) Prior Publication Data

US 2008/0185568 A1 Aug. 7, 2008

(30) Foreign Application Priority Data

Feb. 1, 2007  (KR) ........................ 10-2007-0010703

(51) Int. Cl.
*H01L 47/00* (2006.01)
(52) U.S. Cl. .. 257/2; 257/3; 257/4; 257/5; 257/E31.029; 257/E45.002; 365/148; 365/163
(58) Field of Classification Search .................. 257/2–5, 257/712, 717, 720, E31.029, E45.002; 364/148, 364/163; 365/148, 163
See application file for complete search history.

(56) References Cited

U.S. PATENT DOCUMENTS

| 5,920,788 A | 7/1999 | Reinerg |
| 7,601,995 B2 * | 10/2009 | Happ et al. ..................... 257/213 |

FOREIGN PATENT DOCUMENTS

| JP | 2001-237380 | 8/2001 |
| KR | 10-2003-0055390 | 7/2003 |
| KR | 1020050059400 | 6/2005 |
| KR | 1020050071965 | 7/2005 |
| KR | 10-2006-0047467 | 5/2006 |
| KR | 120060070066 | 6/2006 |
| KR | 10-0695163 | 3/2007 |

OTHER PUBLICATIONS

Notice of Allowance dated Jan. 16, 2008 in corresponding Korean Application No. 10-2007-0010703.

* cited by examiner

*Primary Examiner* — Jerome Jackson, Jr.
*Assistant Examiner* — Yu Chen
(74) *Attorney, Agent, or Firm* — Harness, Dickey & Pierce, P.L.C.

(57) ABSTRACT

Example embodiments provide a nonvolatile memory device using resistive elements. The nonvolatile memory device may include a semiconductor substrate, a plurality of variable resistance patterns on the semiconductor substrate, and a plurality of heat sink patterns that are level with the variable resistance patterns and coupled to a ground voltage.

21 Claims, 16 Drawing Sheets

FIG. 1

| 10_1 | 10_2 | 10_3 | 10_4 | 10_5 | 10_6 | 10_7 | 10_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(20_1) | | SA/WD(20_2) | | SA/WD(20_3) | | SA/WD(20_4) | |
| PERIPHERY(30) | | | | | | | |
| SA/WD(20_8) | | SA/WD(20_7) | | SA/WD(20_6) | | SA/WD(20_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 10_16 | 10_15 | 10_14 | 10_13 | 10_12 | 10_11 | 10_10 | 10_9 |

NONVOLATILE MEMORY DEVICES AND METHOD OF MANUFACTURING THE SAME

PRIORITY STATEMENT

This application claims priority under U.S.C. §119(a) to Korean Patent Application No. 10-2007-0010703, filed on Feb. 1, 2007, in the Korean Intellectual Property Office (KIPO), the entire contents of which are incorporated herein by reference.

BACKGROUND

1. Field

Example embodiments relate to nonvolatile memory devices using resistive elements and a method of manufacturing a nonvolatile memory device.

2. Description of the Related Art

PRAM (Phase change Random Access Memory), RRAM (Resistive RAM) and/or MRAM (Magnetic RAM) are types of nonvolatile memory devices using resistance materials. The DRAM (Dynamic RAM) or a flash memory device stores data by using charges. The nonvolatile memory devices using resistance materials store data by using the change of the state of a phase change material, e.g., a chalcogenide alloy (PRAM), the change of the resistance of variable resistance materials (RRAM), or the change of the resistance of a thin MTJ (Magnetic Tunnel Junction) film depending on the magnetization state of a ferromagnetic material (MRAM).

An example of a PRAM will be described in detail. The phase change material may have a lower resistance in a crystal state and may have a higher resistance in an amorphous state. Accordingly, the crystal state is defined as "set" or 0 data, and the amorphous state is defined as "reset" or 1 data. Further, the PRAM may provide write pulses, e.g., set pulses and reset pulses, to the phase change material, so that the PRAM may perform writing by using joule heat generated due to the pulses. Specifically, when 1 data is written, the phase change material may be heated over a melting temperature by the reset pulses and then quickly cooled to be in an amorphous state. When 0 data is written, the phase change material may be heated in the range of a crystallization temperature to a melting temperature and maintained at that temperature for a predetermined or given time. The phase change material may be cooled to a crystal state.

Increased integration of the PRAM is important for joule heat generated during the writing of data in specific phase change memory cells to have an effect on adjacent phase change memory cells. Specifically, even though specific phase change memory cells are cooled during the writing of 1 data, the temperature in the vicinity of the specific phase change memory cells may be relatively high. As a result, data may be written in undesired phase change memory cells.

SUMMARY

According to example embodiments, there is provided a nonvolatile memory device including a semiconductor substrate, a plurality of variable resistance patterns on the semiconductor substrate, and a plurality of heat sink patterns that are level with the variable resistance patterns and coupled to a ground voltage.

According to example embodiments, there is provided a nonvolatile memory device including a semiconductor substrate, access transistors that include gate electrodes on the semiconductor substrate and first and second junction regions in the semiconductor on both ends of the gate electrodes, a ground voltage line coupled to the first junction region, variable resistance patterns coupled to the second junction region, and heat sink patterns that are coupled to the ground voltage line and provided to be adjacent to the variable resistance patterns.

According to example embodiments, there is provided a nonvolatile memory device including a semiconductor substrate, first and second access transistors that include first and second gate electrodes on the semiconductor substrate to extend in a first direction, a first junction region in the semiconductor substrate between the first and second gate electrodes, a second junction region in one side of the first gate electrode opposite to the first junction region, and a third junction region in one side of the second gate electrode opposite to the first junction region, a ground voltage line that is coupled to the first junction region and extends in the first direction, first and second variable resistance patterns coupled to the second and third junction regions, respectively, and heat sink patterns that are coupled to the ground voltage line and formed between the first and second variable resistance patterns so as to extend in the first direction.

According to example embodiments, there is provided a method of manufacturing a nonvolatile memory device, the method including forming access transistors that include gate electrodes formed on a semiconductor substrate and first and second junction regions formed in the semiconductor substrate on both ends of the gate electrodes, forming a ground voltage line coupled to the first junction region and landing pads coupled to the second junction region, forming variable resistance patterns on the landing pads, and forming heat sink patterns on the ground voltage line so that the heat sink patterns are adjacent to the variable resistance patterns.

BRIEF DESCRIPTION OF THE DRAWINGS

Example embodiments will be more clearly understood from the following detailed description taken in conjunction with the accompanying drawings. FIGS. 1-9 represent non-limiting, example embodiments as described herein.

FIG. 1 is a block diagram illustrating nonvolatile memory devices according to example embodiments;

FIG. 2 is a circuit diagram illustrating the nonvolatile memory devices according to example embodiments;

FIG. 4 is a perspective view illustrating the nonvolatile memory device according to example embodiments;

FIG. 5 is a conceptual view illustrating a heat sink pattern used in the nonvolatile memory device according to example embodiments;

FIGS. 6-9 are layouts illustrating nonvolatile memory devices according to example embodiments.

Figure 2:
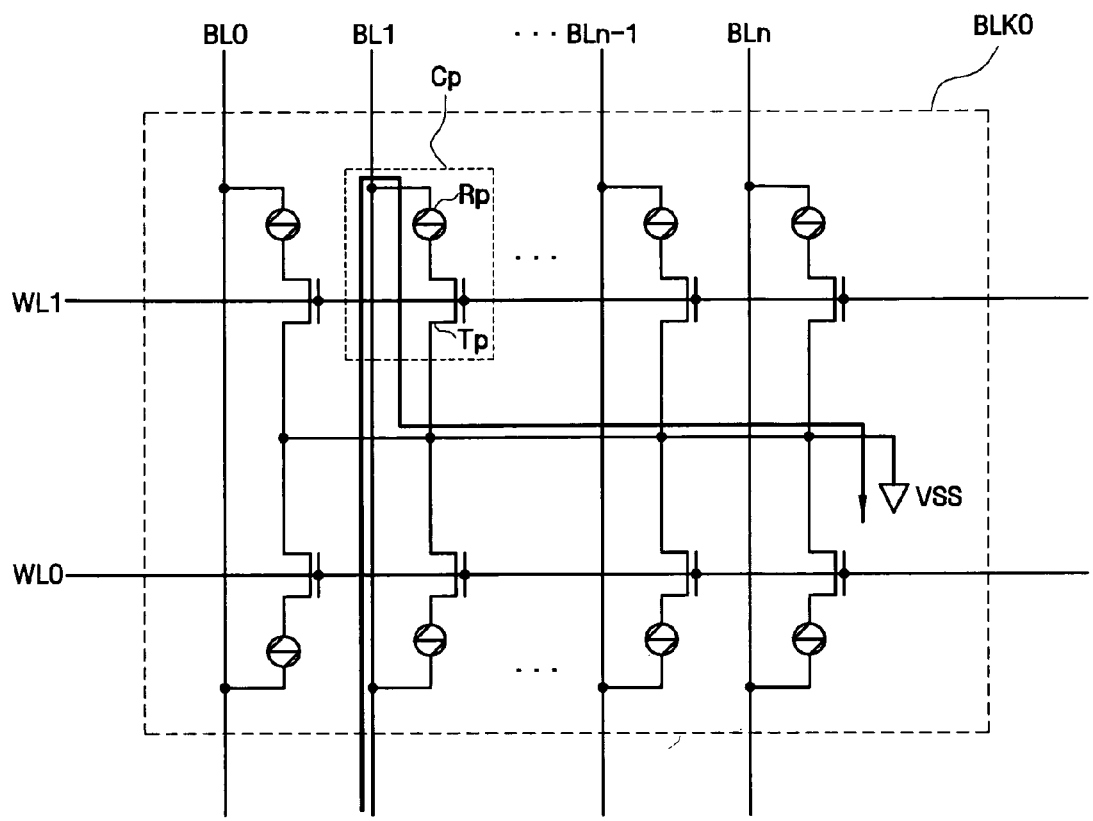

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/ or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Details of other embodiments are included in the detailed description and drawings. Advantages and features of example embodiments and methods of accomplishing the same may be understood more readily by reference to the following detailed description of example embodiments and the accompanying drawings. Example embodiments may, however, be embodied in many different forms and should not be construed as being limited to the embodiments set forth herein. Rather, these embodiments are provided so that this disclosure will be thorough and complete and will fully convey the concept of example embodiments to those skilled in the art, and example embodiments will only be defined by the appended claims. Like reference numerals refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numbers refer to like elements throughout. As used herein, the term "and/or" includes any and all combinations of one or more of the associated listed items.

Terms such as first and second are used to describe various elements, components, and/or sections. However, the elements, components, and/or sections are not limited by the terms. The terms are used to merely distinguish an element, component, or section from other elements, components, or sections. Accordingly, a first element, first component, or first section may be a second element, second component, or second section, without departing from the scope and spirit of example embodiments.

The terminology used herein is for the purpose of describing particular embodiments only and is not intended to be limiting of example embodiments. As used herein, the singular forms are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As long as being not specially defined, all terms (including technical and scientific terms) used in the context of describing example embodiments may be commonly understood to those skilled in the art. Further, as long as being not specially defined, terms that are widely used and defined in a dictionary are not ideally or exaggeratedly interpreted.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented and the spatially relative descriptors used herein interpreted accordingly.

Hereinafter, example embodiments will be described with PRAM (Phase change Random Access Memory). However, it is apparent to those skilled in the art that example embodiments may be applied to a nonvolatile memory device using resistive elements, e.g., RRAM (Resistive RAM) and MRAM (Magnetic RAM).

FIG. 1 is a block diagram illustrating nonvolatile memory devices according to example embodiments, and FIG. 2 is a circuit diagram illustrating the nonvolatile memory devices according to example embodiments. Sixteen memory banks are examples illustrated for convenience of description, but example embodiments are not limited thereto. Further, for convenience of description, the only region relating to a first memory block BLK0 is mainly shown in FIG. 2.

First, referring to FIG. 1, a nonvolatile memory device according to example embodiments may include a plurality of memory banks 10_1 to 10_16, a plurality of sense amplifiers (not shown), write drivers 20_1 to 20_8, and a peripheral circuit region 30.

Each of the memory banks 10_1 to 10_16 may be composed of a plurality of memory blocks BLK0 to BLK7, and each of the memory blocks 10_1 to 10_16 may include a plurality of variable resistance memory cells arranged in a matrix. Although eight memory blocks are provided in each memory bank in example embodiments, example embodiments are not limited thereto. Each of the variable resistance memory cells may include a variable resistive element and an access element. The variable resistive element may include a variable resistance material that has two different resistance values depending on a crystal or amorphous state, and the access element may control current flowing in the variable resistive element.

Further, the access element may be a diode or transistor that is coupled to the variable resistive element in series. Furthermore, various materials, for example, GaSb, InSb, InSe, $Sb_2Te_3$, or GeTe, which may include two chemical elements combined with each other, GeSbTe, GaSeTe, InSbTe, $SnSb_2Te_4$, or InSbGe, which may include three chemical elements combined with each other, or AgInSbTe, (GeSn)SbTe, GeSb(SeTe), or $Te_{81}Ge_{15}Sb_2S_2$, which may include four chemical elements combined with each other, may be used as the variable resistance material. Among them, GeSbTe, made of germanium (Ge), antimony (Sb), and tellurium (Te), may be generally used as the variable resistance material. Although not shown in detail in FIG. 1, row decoders and column decoders for specifying rows and columns, which correspond to the memory banks 10_1 to 10_16, of variable resistance memory cells to be written or read, are provided.

The sense amplifiers and the write drivers 20_1 to 20_8 may be provided to correspond to two memory banks 10_1 to 10_16, and may perform a read operation and a write operation in the corresponding memory banks. Although the sense amplifiers and the write drivers 20_1 to 20_8 correspond to two memory banks 10_1 to 10_16 in example embodiments, example embodiments are not limited thereto. For example, the sense amplifiers and the write drivers 20_1 to 20_8 may be provided to correspond to one or four memory banks. A voltage generator and a plurality of logic circuit blocks may be provided in the peripheral circuit region 30. The plurality of logic circuit blocks may operate the row decoder, the column decoders, the sense amplifiers, and the write drivers.

Referring to FIG. 2, the nonvolatile memory device according to example embodiments may include a memory block BLK0, a plurality of bit lines BL0 to BLn, and a plurality of word lines WL0 and WL1. The memory block BLK0 may include a plurality of variable resistance memory cells Cp. The plurality of variable resistance memory cell Cp may be provided on regions where the word lines WL0 and WL1 and the bit lines BL0 to BLn cross each other. Each of the variable resistance memory cells Cp may include a variable resistance material Rp and an access element Tp.

The state of the variable resistance material Rp may change into a crystal or amorphous state depending on flowing current, and the resistance of the variable resistance material Rp may be different in each state. The access element Tp may control current flowing in the variable resistance material Rp. The variable resistance material Rp may be connected between the word lines WL0 and WL1 and the access element Tp, and an access transistor may be used as the access element Tp. Adjacent access elements Tp share one node, for example, a node to which a ground voltage is applied, with each other. However, example embodiments are not limited thereto. For example, adjacent access elements may not share a node with each other.

Hereinafter, the operation of the nonvolatile memory device will be described with reference to FIG. 2. First, in the write operation of the nonvolatile memory device, the variable resistance material Rp may be heated over a melting temperature Tm and then quickly cooled to be in an amorphous state of LOGIC LEVEL 1. Alternatively, after being heated in the range of a crystallization temperature Tx to a melting temperature Tm and maintained at that temperature for a predetermined or given time, the variable resistance material Rp may be cooled to be in a crystal state of LOGIC LEVEL 0. Write current corresponding to a relatively high level may flow in the variable resistance material Rp to change the phase of the variable resistance material Rp. For example, write current for reset may be about 1 mA, and write current for set may be in the range of about 0.6 mA to about 0.7 mA. The write current may be supplied from a write circuit (not shown) and discharged to a ground voltage through the bit lines BL0 to BLn and the access element Tp (see an arrow shown in FIG. 2).

In the read operation of the nonvolatile memory device, read current corresponding to a level not changing the phase of the variable resistance material Rp may be supplied to the variable resistance material Rp, so that stored data may be read. The read current may be supplied from a read circuit (not shown) and discharged to the ground voltage through the bit lines BL0 to BLn and the access element Tp.

Figure 3A:
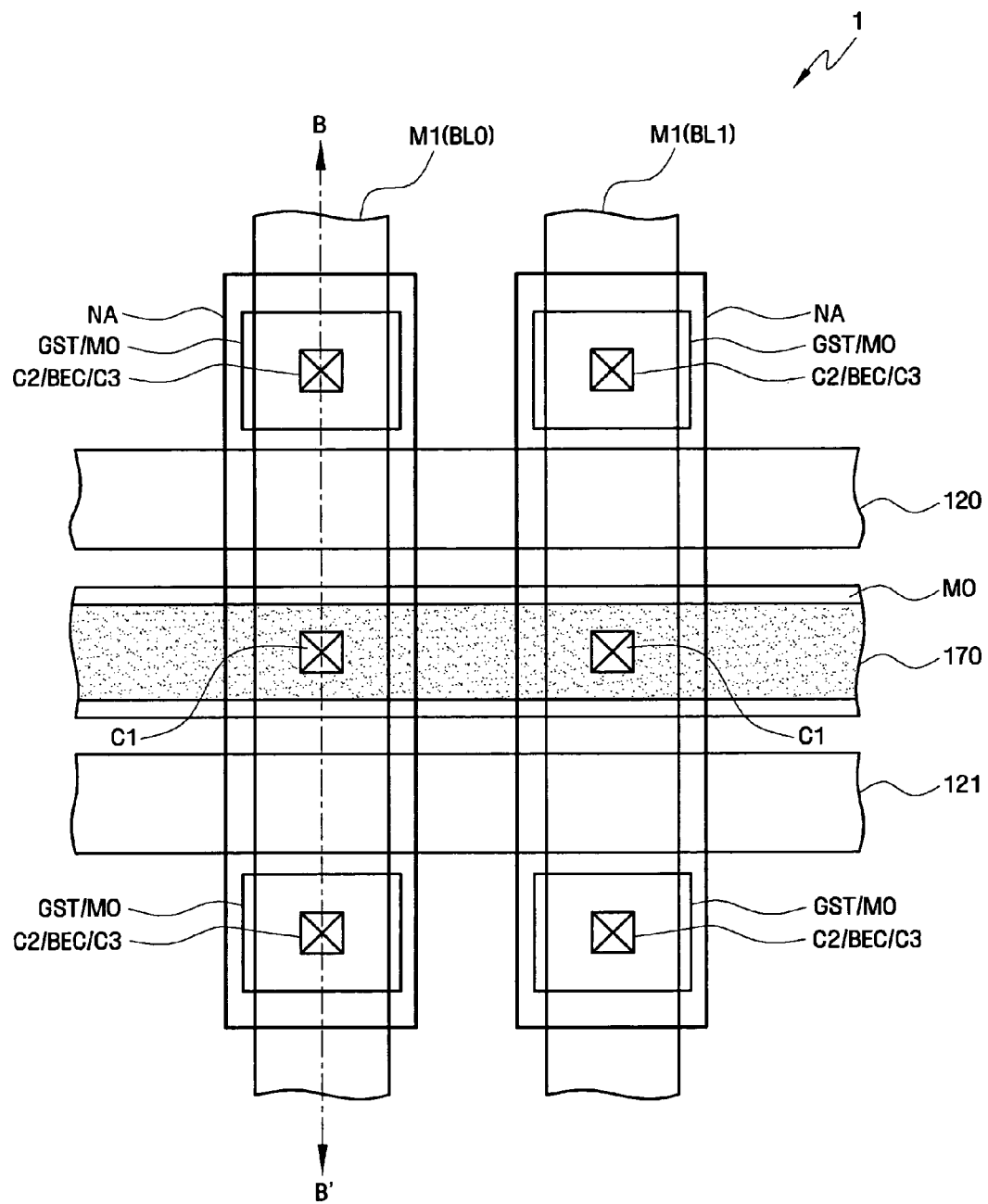
FIG. 3A is a layout illustrating a nonvolatile memory device according to example embodiments.
Figure 3B:
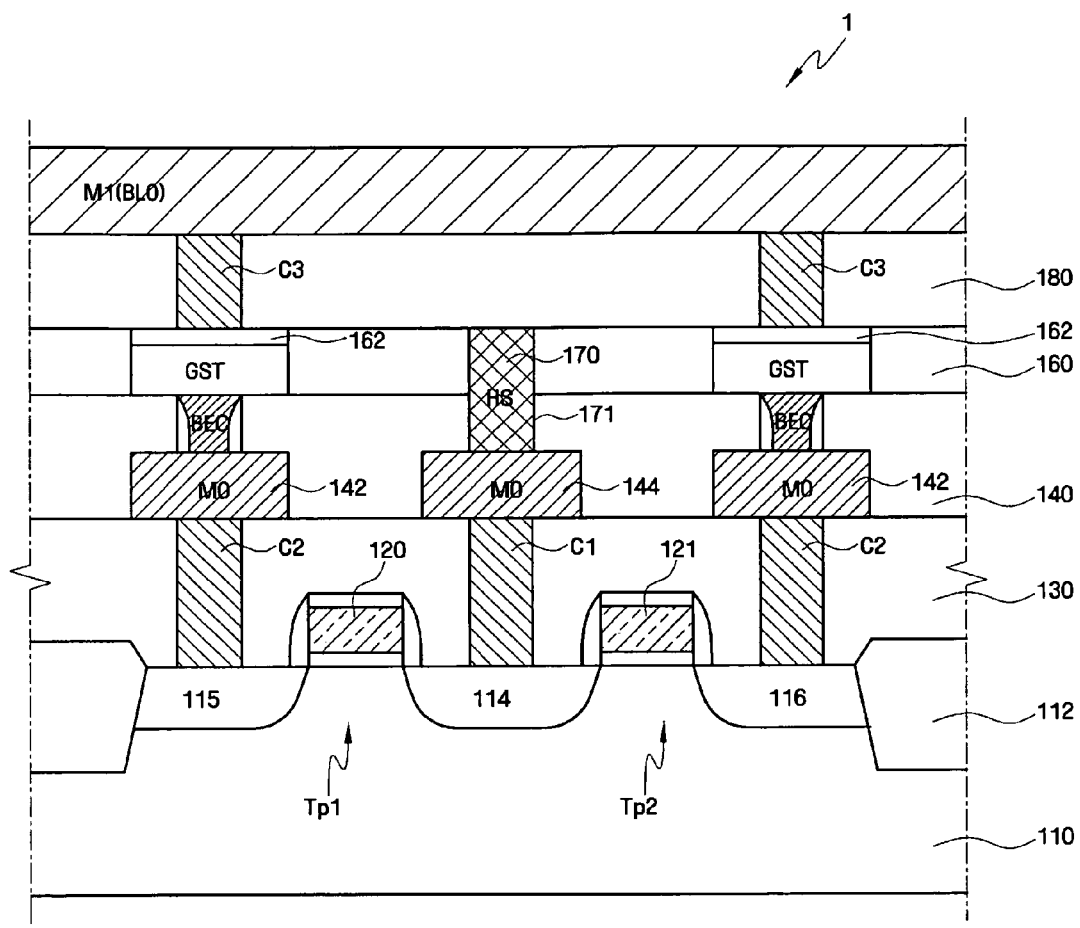
FIG. 3B is a cross-sectional view taken along a line B-B' of FIG. 3A.
Figure 4:
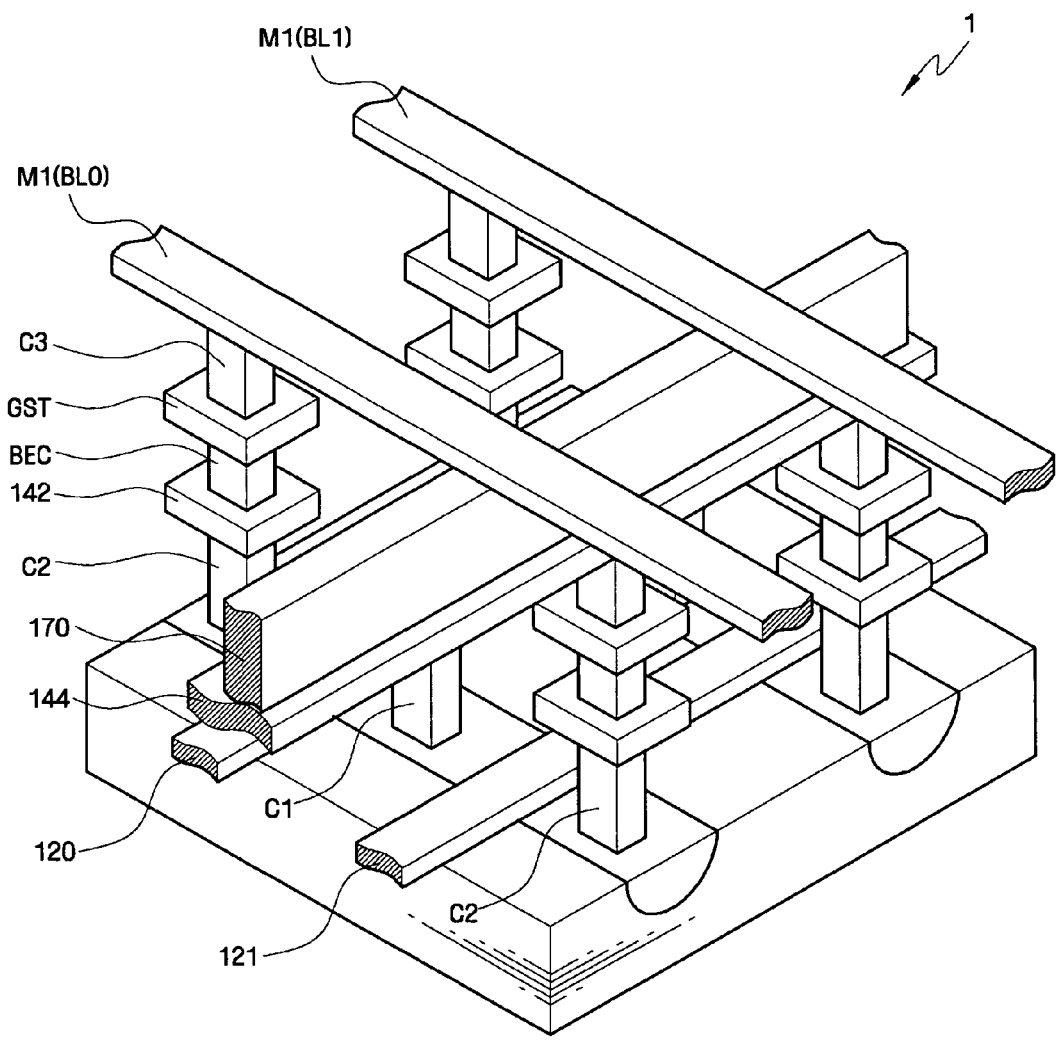
Figure 5:
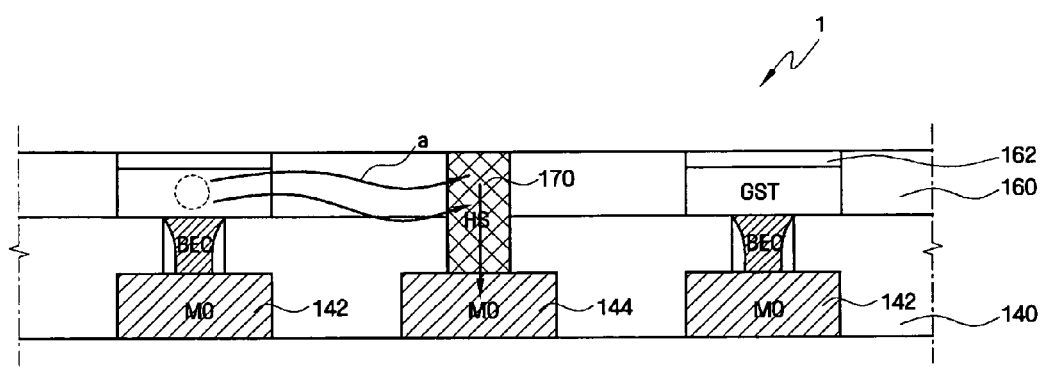

FIG. 3A is a layout illustrating a nonvolatile memory device according to example embodiments, and FIG. 3B is a cross-sectional view taken along a line B-B' of FIG. 3A. FIG. 4 is a perspective view illustrating the nonvolatile memory device according to example embodiments. For convenience of description, an inter-layer dielectric film and/or inter-metal dielectric film will be omitted in FIG. 4. FIG. 5 is a conceptual view illustrating a heat sink pattern used in the nonvolatile memory device according to example embodiments.

Referring to FIGS. 3A, 3B, and 4, for example, element isolation regions 112 may be formed on a P-type semiconductor substrate 110 to define active regions NA. A silicon substrate, an SOI (Silicon On Insulator) substrate, a gallium arsenide substrate, a silicon germanium substrate, a ceramic substrate, a quartz substrate, or a display glass substrate may be used as the semiconductor substrate 110. Further, a FOX (Field OXide) or a STI (Shallow Trench Isolation), which is formed using a LOCOS (LOCal Oxidation of Silicon) method, may be used in each of the element isolation regions 112.

First and second access transistors Tp1 and Tp2 may be formed on the semiconductor substrate 110. The first and second access transistors Tp1 and Tp2 may include first and second gate electrodes 120 and 121 that are formed on the semiconductor substrate 110 to extend in a first direction, a first junction region 114 formed in the semiconductor substrate 110 between the first and second gate electrodes 120 and 121, a second junction region 115 formed in the semiconductor substrate 110 on one side of the first gate electrode 120 opposite to the first junction region 114, and a third junction region 116 formed in the semiconductor substrate 110 in one side of the second gate electrode 121 opposite to the first junction region 114.

The first junction region 114 may be a node (for example, a source node) shared by the first and second access transistors Tp1 and Tp2, and the second junction region 115 may be a drain node of the first access transistor Tp1. Further, the third junction region 116 may be a drain node of the second access transistor Tp2. Although the first and second access transistors Tp1 and Tp2 share one node with each other in FIG. 3B, example embodiments are not limited thereto.

An inter-layer dielectric film (ILD) 130 may be formed on the semiconductor substrate 110, and may include a plurality of contact holes through which the first junction region 114 and the second and third junction regions 115 and 116 are exposed to the outside. A FOX (Flowable OXide) film, a USG (Undoped Silicate Glass) film, a BSG (Borosilicate Glass) film, a PSG (PhosphoSilicate Glass) film, a BPSG (BoroPhosphoSilicate Glass) film, a PE-TEOS (Plasma Enhanced-Tetra Ethyl Ortho Silicate) film, a FSG (Fluoride Silicate Glass) film, or a HDP (High Density Plasma) film may be used as the inter-layer dielectric film 130. The inter-layer dielectric film 130 may be formed using a CVD-based method. The CVD-based method may include ALD (Atomic Layer Deposition), PEALD (Plasma Enhanced Atomic Layer Deposition), MOCVD (Metal Organic Chemical Vapor Deposition) and/or PECVD (Plasma Enhanced Chemical Vapor Deposition).

A first contact C1 that is connected to the first junction region 114, and second contacts C2 that are connected to the second and third junction regions 115 and 116, may be formed in the plurality of contact holes. A ground voltage line 144 extending in the first direction may be formed on each of the first contacts C1 and the inter-layer dielectric film 130, and landing pads 142 may be formed on the second contacts C2 and the inter-layer dielectric film 130. The ground voltage line 144 and the landing pads 142 may be made of aluminum, copper and/or tungsten. The first and second contacts C1 and C2, the ground voltage line 144, the landing pads 142 may be separately formed in FIG. 3B, but may be simultaneously formed using a dual damascene method.

A first inter-metal dielectric film 140 may be formed on the ground voltage line 144, the landing pads 142, and the inter-layer dielectric film 130. The first inter-metal dielectric film 140 may include a plurality of contact holes through which the upper surfaces of the ground voltage line 144 and the landing pads 142 are partially exposed to the outside. A silicon oxide (SiOx) film, for example, a FOX (Flowable OXide) film, a USG (Undoped Silicate Glass) film, a BSG (Boro Silicate Glass) film, a PSG (Phospho Silicate Glass) film, a BPSG (BoroPhospho Silicate Glass) film, a PE-TEOS (Plasma Enhanced-Tetra Ethyl Ortho Silicate) film, a FSG (Fluoride Silicate Glass) film, or a HDP (High Density Plasma) film may be used as the first inter-metal dielectric film 140. Each of the contact holes may be filled with a bottom electrode contact BEC. For example, TiN may be used as the bottom electrode contact BEC.

A plurality of variable resistive patterns GST connected to the bottom electrode contacts BEC may be formed on the bottom electrode contacts BEC and the first inter-metal dielectric film 140. Various materials, for example, GaSb, InSb, InSe, $Sb_2Te_3$, or GeTe, which include two chemical elements combined with each other, GeSbTe, GaSeTe, InSbTe, $SnSb_2Te_4$, or InSbGe, which may include three chemical elements combined with each other, or AgInSbTe, (GeSn)SbTe, GeSb(SeTe), or $Te_{81}Ge_{15}Sb_2S_2$, which may include four chemical elements combined with each other, may be used as the phase change material forming the variable resistive patterns GST. Among them, GeSbTe, made of germanium (Ge), antimony (Sb), and tellurium (Te), may be generally used as the phase change material.

Top electrode contacts TEC 162 may be formed on the variable resistive patterns GST. Each of the top electrode contacts 162 may be formed by laminating, for example, Ti/TiN. A second inter-metal dielectric film 160 may be formed on the first inter-metal dielectric film 140. A contact hole 171, through which the upper surface of the ground voltage line 144 is partially exposed to the outside, may be formed through the first and second inter-metal dielectric films 140 and 160. The second inter-metal dielectric film 160 may be a silicon oxide (SiOx) film.

A heat sink pattern 170 may be formed in the contact hole 171 passing through the first and second inter-metal dielectric films 140 and 160. The heat sink pattern 170 may be connected to the ground voltage line 144. Further, the heat sink pattern 170 may be level with the variable resistance patterns GST, and may be made of a material having a thermal conductivity larger than the variable resistance patterns GST. For example, the heat sink pattern 170 may include metal, e.g., aluminum and/or a nanotube. The heat sink pattern 170, which is formed between the first and second variable resistance patterns GST and extends in the first direction in parallel with the gate electrodes 120 and 121, (for example, line type heat sink pattern) has been exemplified in example embodiments. However, example embodiments are not limited thereto.

Referring to FIG. 5, the heat sink pattern 170 may prevent or reduce joule heat, which is generated from a variable resistance memory cell to be written, from being transferred to adjacent variable resistance memory cells. For example, since the heat sink pattern 170 has a thermal conductivity larger than the variable resistance patterns GST, the joule heat transferred to the adjacent variable resistance memory cells may be transferred to the heat sink pattern 170 and may then be radiated to the outside through the ground voltage line 144 (see reference character "a"). Accordingly, the nonvolatile memory device using the heat sink pattern 170 may be highly integrated.

Returning to FIGS. 3A, 3B, and 4, a third inter-metal dielectric film 180 including a plurality of contact holes may be formed on the top electrode contacts 162 and heat sink pattern 170. The third inter-metal dielectric film 180 may be an oxide ($SiO_x$) film. Each of the contact holes may be filled with a bit line contact plug C3. For example, TiN may be used as the bit line contact plug C3. A bit line BL0 crossing the first and second gate electrodes 120 and 121 may be formed on the bit line contact plugs C3. For example, aluminum (Al) or tungsten (W) may be used as the bit line BL0.

Figure 6:
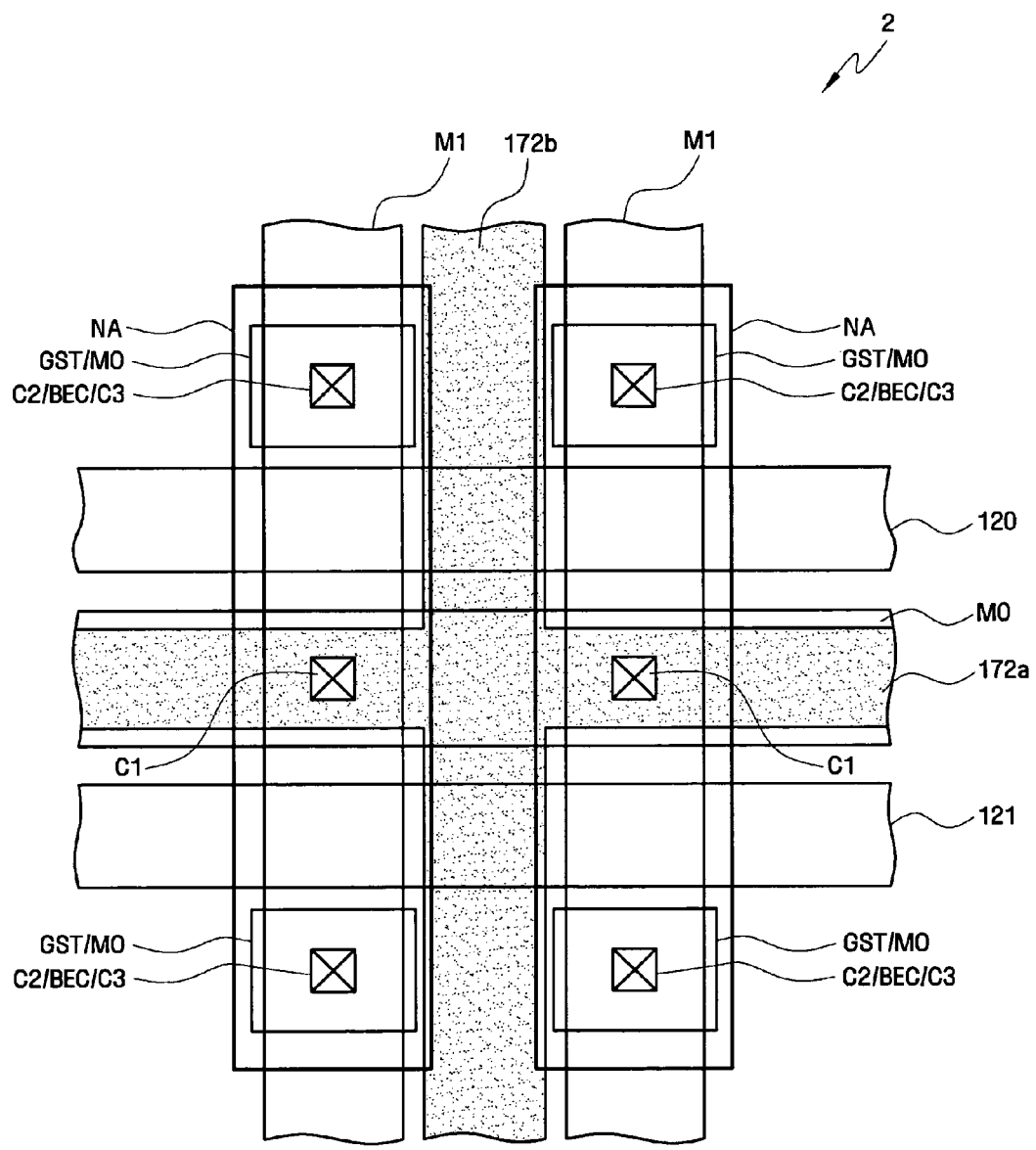

FIG. 6 is a layout illustrating a nonvolatile memory device according to example embodiments. Referring to FIG. 6, in a nonvolatile memory device 2 according to example embodiments, heat sink patterns 172a and 172b may be level with a plurality of variable resistance patterns GST, and may be line cross-type heat sink patterns. For example, the heat sink patterns 172a and 172b may be composed of a first sub-heat sink pattern 172a that is formed on a ground voltage line 144 and may extend in a first direction in parallel with the ground voltage line 144, and a second sub-heat sink pattern 172b that extends in a second direction to cross the first direction.

Figure 7:
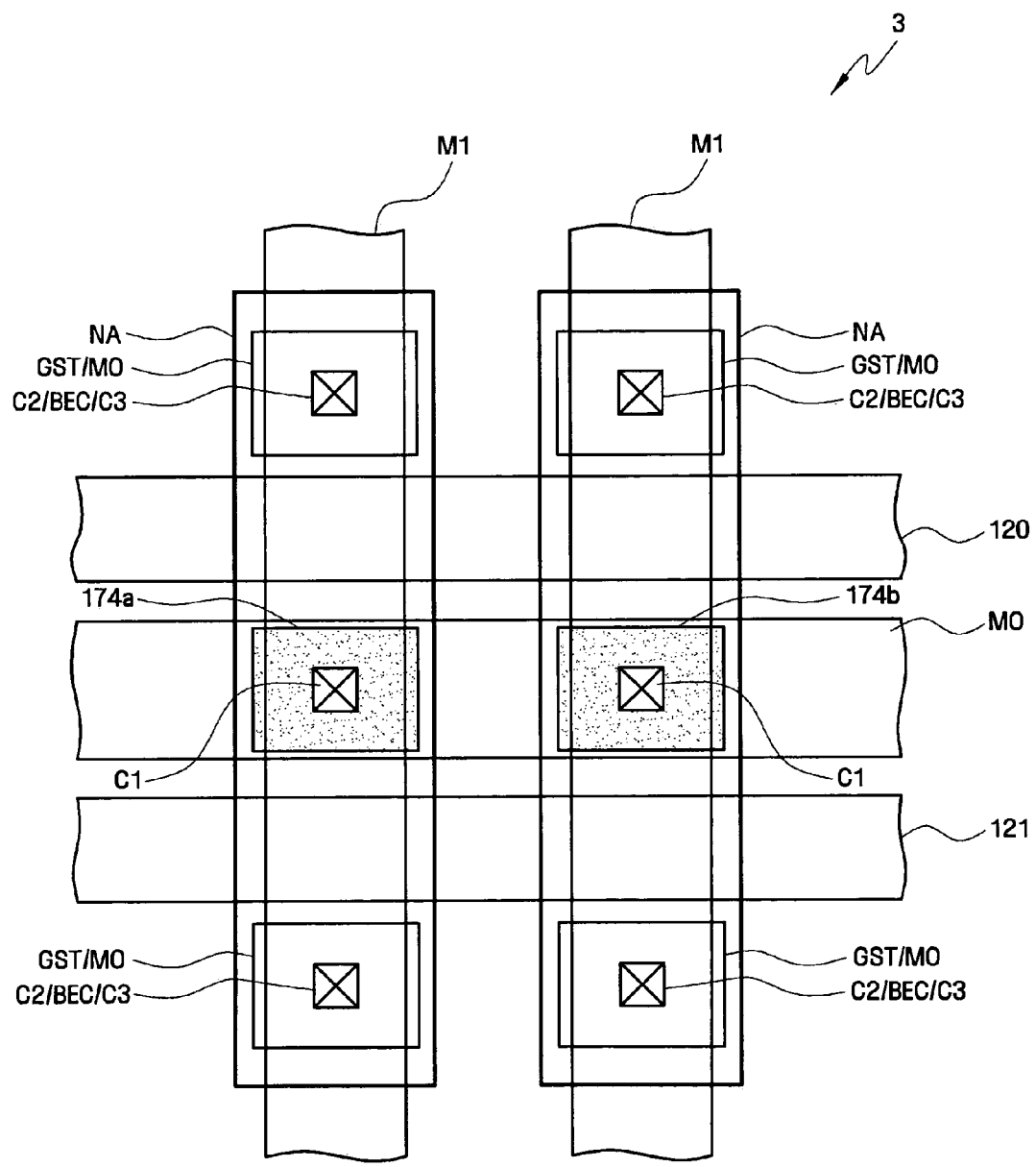

FIG. 7 is a layout illustrating a nonvolatile memory device according to example embodiments. Referring to FIG. 7, in a nonvolatile memory device 3 according to example embodiments, heat sink patterns 174a and 174b may be formed on a ground voltage line 144 so as to be spaced apart from each other in a first direction. For example, the heat sink patterns may be dot type heat sink patterns. For example, the heat sink patterns 174a and 174b may be provided between adjacent variable resistance patterns GST so as to prevent or reduce joule heat, which is generated from one variable resistance pattern GST, from being transferred to the other variable resistance pattern GST.

Figure 8:
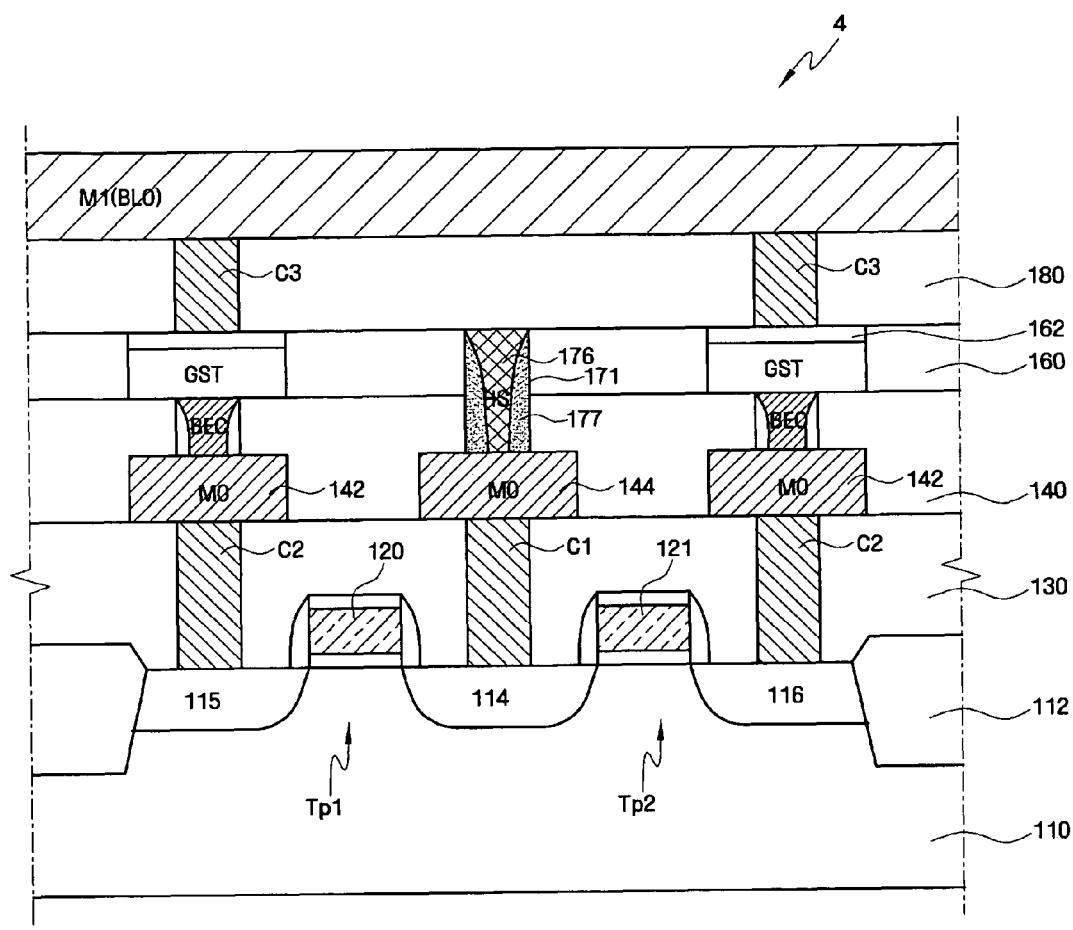

FIG. 8 is a layout illustrating a nonvolatile memory device according to example embodiments. Referring to FIG. 8, a nonvolatile memory device 4 according to example embodiments may further include a spacer 177 for defining the width of a heat sink pattern 176. Specifically, the spacer 177 may be formed on the inner surface of a contact hole 171, and a heat sink pattern 176 may be formed so as to fill the contact hole 171. For this reason, even though a distance between nonvolatile memory cells is decreased due to higher integration of the nonvolatile memory device, the heat sink pattern 176 may be formed between the variable resistance patterns GST so that the heat sink pattern 176 may be electrically insulated from the variable resistance patterns GST.

Figure 9:
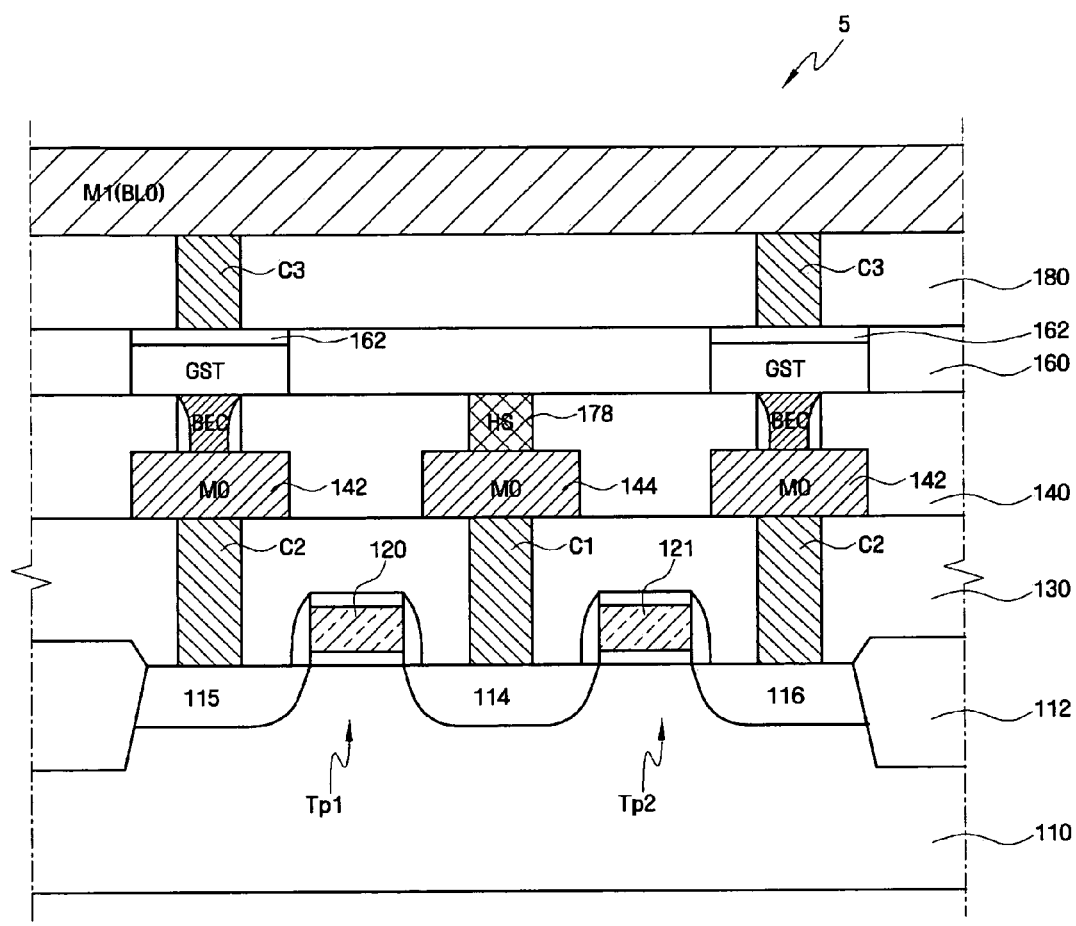

FIG. 9 is a layout illustrating a nonvolatile memory device according to example embodiments. Referring to FIG. 9, in a nonvolatile memory device 5 according to example embodiments, the upper surface of a heat sink pattern 178 may be lower than that of each of the variable resistance patterns GST. Heat transfer prevention effect between adjacent variable resistance patterns GST may be decreased as compared to example embodiments using the heat sink pattern 170.

Figure 10A:
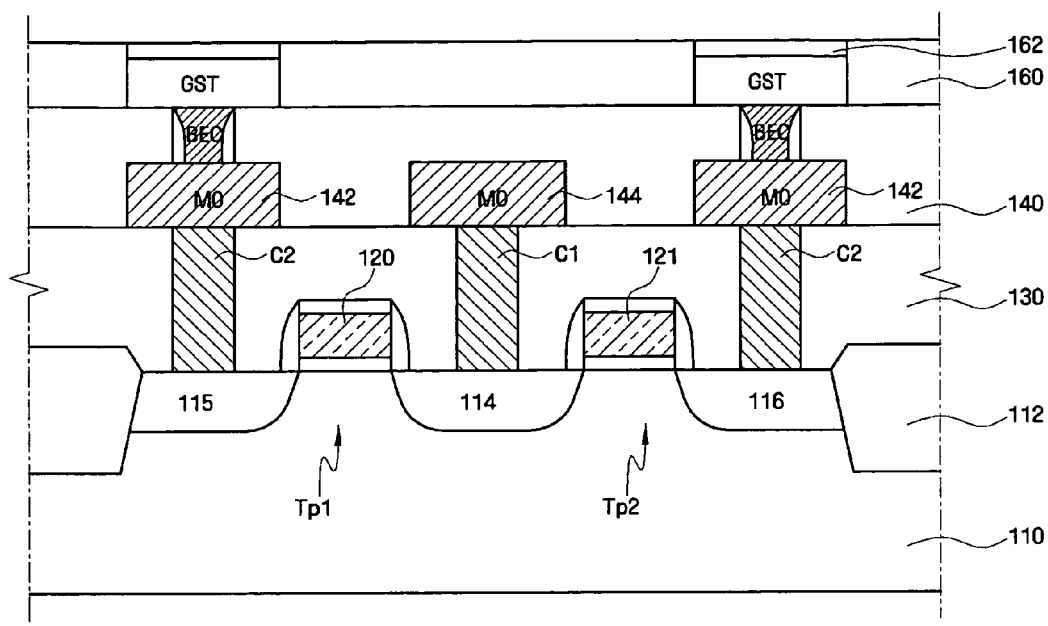
FIGS. 10A to 10C and FIGS. 11A to 11C are cross-sectional views illustrating processes of a method of manufacturing the nonvolatile memory device according to example embodiments.
Figure 10B:
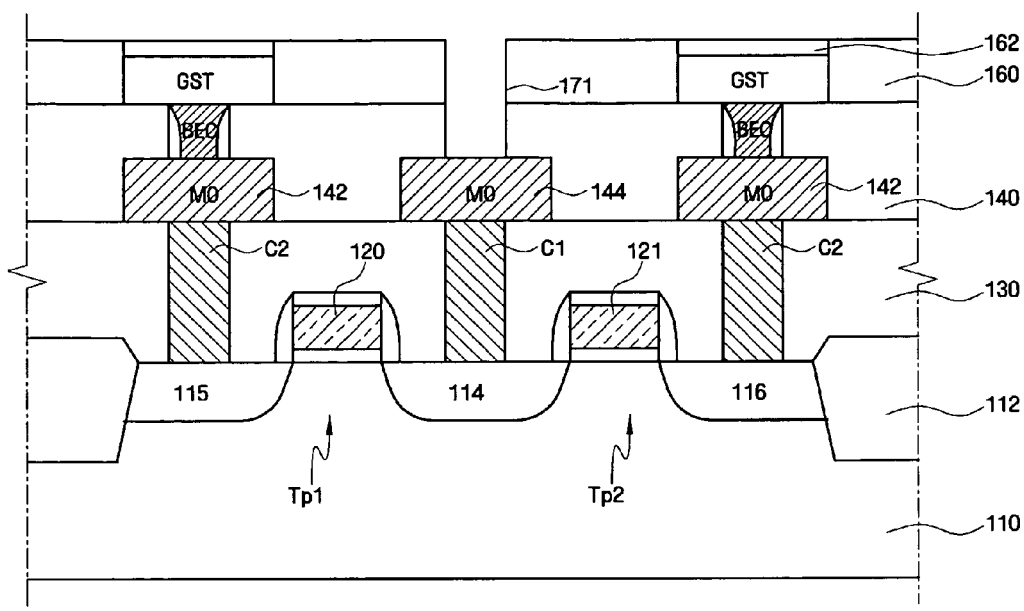
Figure 10C:
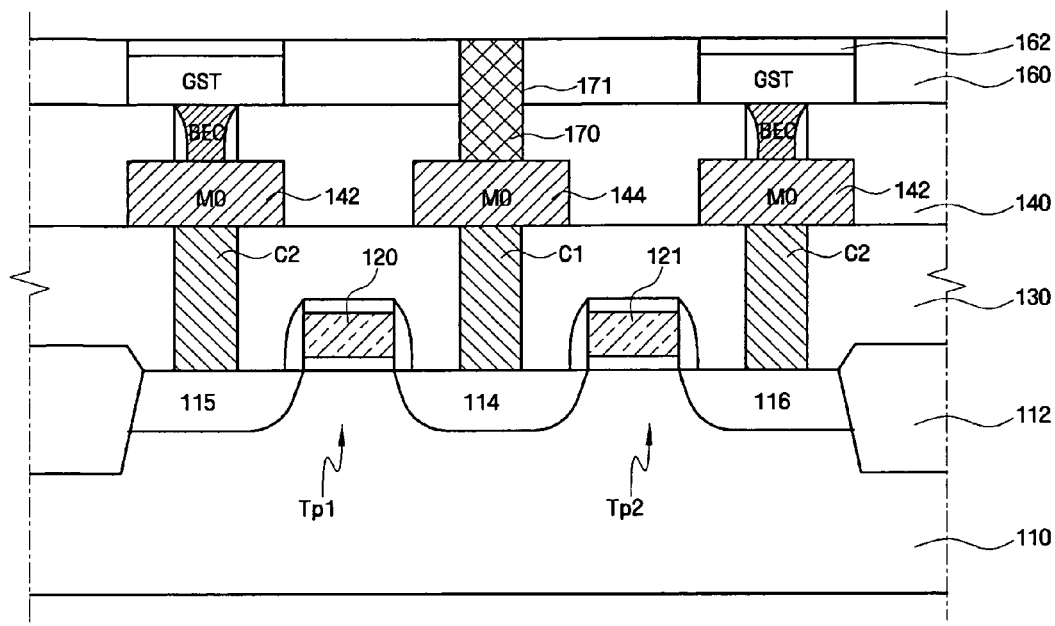

Hereinafter, a method of manufacturing the nonvolatile memory device according to example embodiments will be described with reference to FIGS. 10A, 10B, 10C, and 3B. FIGS. 10A to 10C are cross-sectional views illustrating processes of a method of manufacturing the nonvolatile memory device according to example embodiments.

First, referring to FIG. 10A, first and second gate electrodes 120 and 121, a first junction region 114, and second and third junction regions 115 and 116 may be formed on a semiconductor substrate 110. The first junction region 114 may be formed between the first and second gate electrodes 120 and 121, and the second and third junction regions 115 and 116 may be formed on the outside of the first and second gate electrodes 120 and 121.

Subsequently, an inter-layer dielectric film 130 may be formed on the semiconductor substrate 110, and may include a plurality of contact holes through which the first junction region 114 and the second and third junction regions 115 and 116 are exposed to the outside. A first contact C1 that is connected to the first junction region 114, and second contacts C2 that are connected to the second and third junction regions 115 and 116 may be formed in the plurality of contact holes.

After that, a ground voltage line 144, which is connected to the first contact C1 and extends in a first direction, may be formed. Landing pads 142 connected to the second contacts C2 may be formed. A first inter-metal dielectric film 140 may be formed on the ground voltage line 144, the landing pad 142, and the inter-layer dielectric film 130. The first inter-metal dielectric film 140 may include a plurality of contact holes through which the upper surfaces of the ground voltage line 144 and landing pads 142 are partially exposed to the outside. A bottom electrode contact BEC connected to each landing pad 142 may be formed in each of the contact holes.

Subsequently, variable resistive patterns GST connected to the bottom electrode contacts BEC, and top electrode contacts 162 may be formed. A second inter-metal dielectric film 160 may be formed on first inter-metal dielectric film 140. Referring to FIG. 10b, a contact hole 171, through which the upper surface of the ground voltage line 144 is partially exposed to the outside, may be formed through the first and second inter-metal dielectric films 140 and 160.

Referring to FIG. 10C, a heat sink pattern 170 may be formed so as to fill the contact hole 171. The heat sink pattern 170 may be level with the variable resistance patterns GST, and may be made of a material having a thermal conductivity larger than the variable resistance patterns GST. For example, the heat sink pattern 170 may include metal, e.g., aluminum or a nanotube. The heat sink pattern 170, which is formed between the first and second variable resistance patterns GST and extends in the first direction in parallel with the gate electrodes 120 and 121, (for example, line type heat sink pattern) has been illustrated in example embodiments. However, example embodiments are not limited thereto.

The formation of the heat sink pattern 170 will be described below. A conductive film for heat sink patterns may be formed on the second inter-metal dielectric film 160 to have a sufficient height so that the contact hole 171 may be filled with the conductive film. The conductive film may be planarized so that the upper surface of the second inter-metal dielectric film 160 may be exposed to the outside. As a result, the heat sink pattern 170 may be completed.

Referring to FIG. 3B, a third inter-metal dielectric film 180 including a plurality of contact holes may be formed on the top electrode contacts 162, and a bit line contact plug C3 may be formed in each of the contact holes. A bit line BL0 crossing the first and second gate electrodes 120 and 121 may be formed on the bit line contact plugs C3.

Figure 11A:
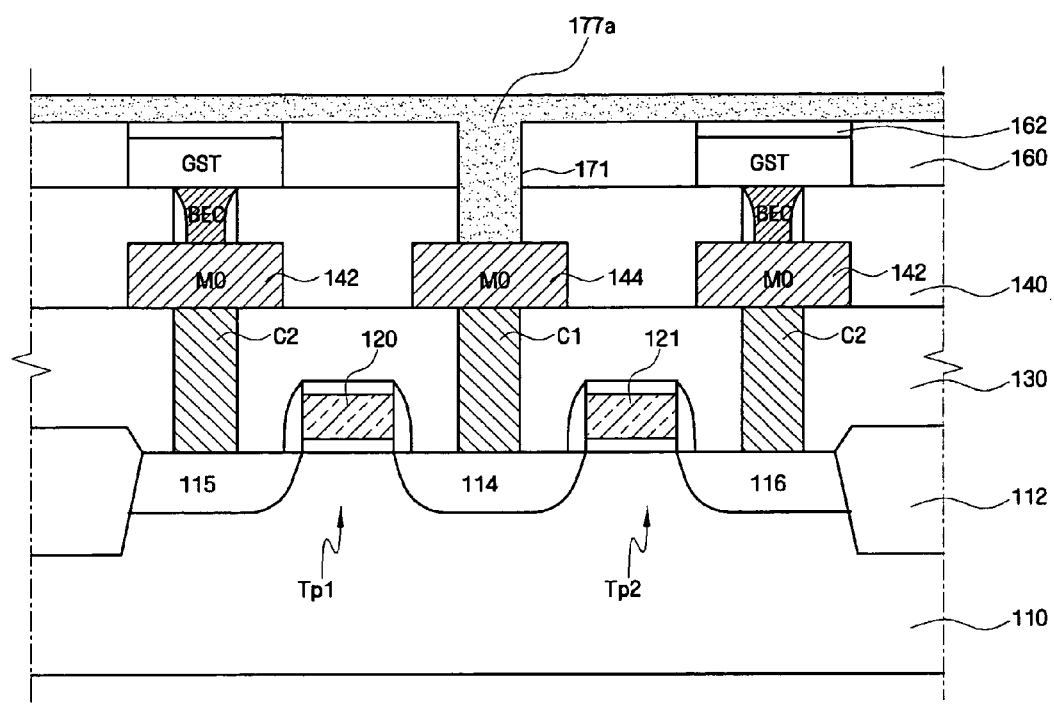
Figure 11B:
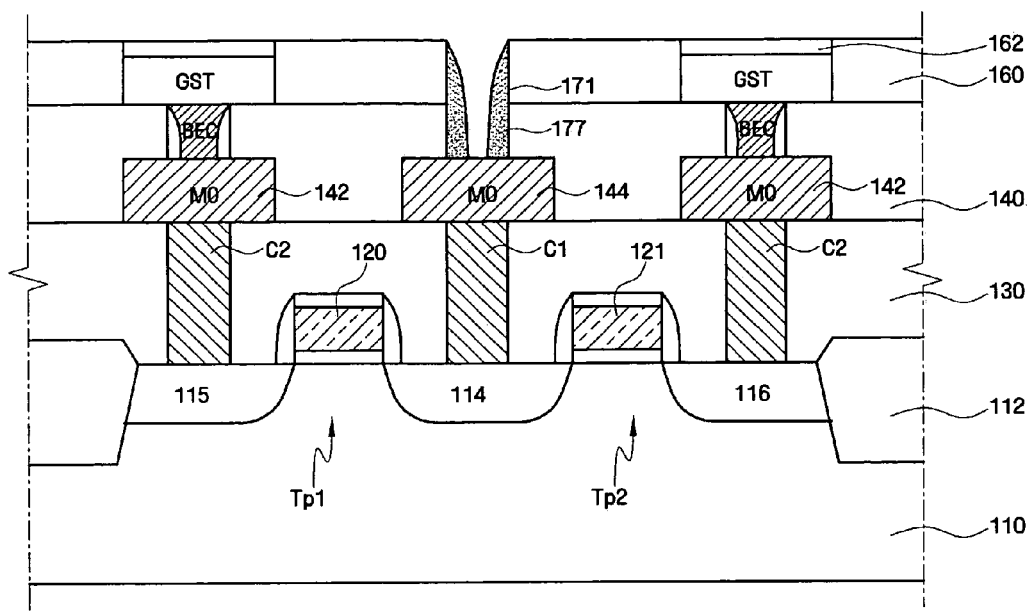
Figure 11C:
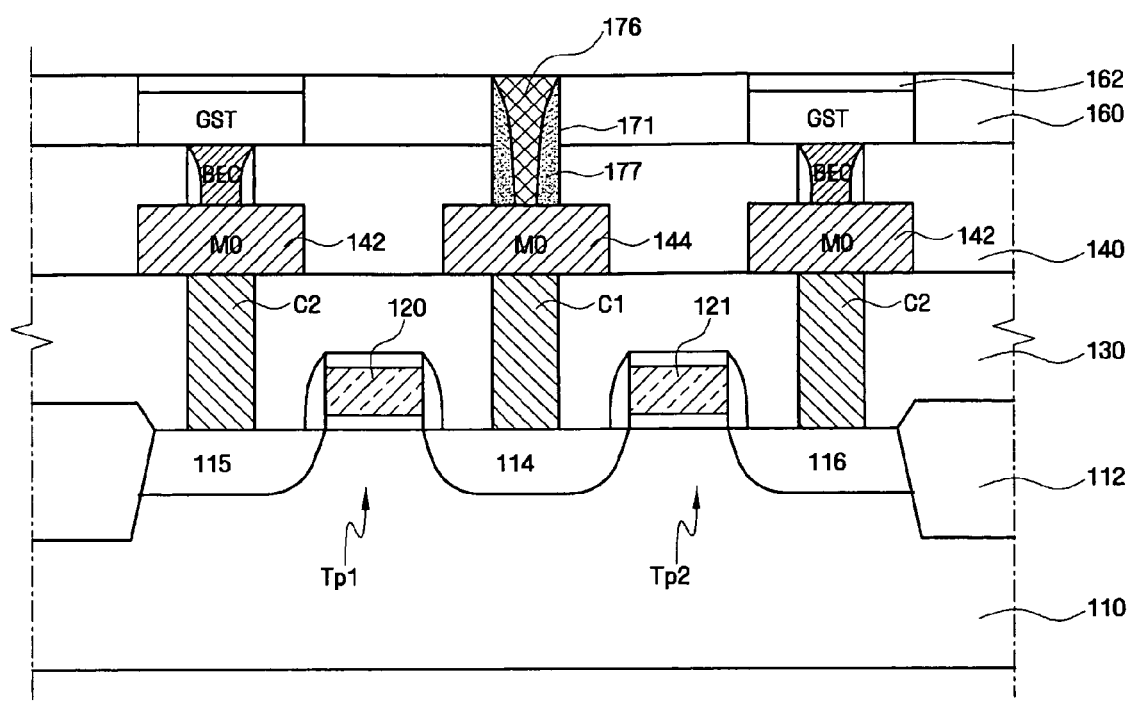

A method of manufacturing the nonvolatile memory device according to example embodiments will be described with reference to FIGS. 11A, 11b, and 11C. FIGS. 11A to 11C are cross-sectional views illustrating processes of a method of manufacturing the nonvolatile memory device according to example embodiments. Referring to FIG. 11A, a dielectric film 177a for a spacer may be formed on the second inter-metal dielectric film 160 so that the contact hole 171 may be filled with the dielectric film 177a. Referring to FIG. 11b, an etch-back process may be performed on the dielectric film 177a for a spacer so as to form a spacer 177 in the contact hole 171. Referring to FIG. 11C, a heat sink pattern 176 may be formed in the contact hole 171 in which the spacer 177 is formed.

Since those skilled in the art could devise a method of manufacturing the nonvolatile memory devices according to the example embodiments from the method of manufacturing the nonvolatile memory device according to the example embodiment illustrated in FIGS. 3A-5, the descriptions thereof will be omitted.

Although example embodiments have been described, it will be apparent to those skilled in the art that various modifications and changes may be made thereto without departing from the scope and spirit of the following claims. Therefore, it should be understood that the above embodiments are not limitative, but illustrative in all aspects.

According to the above-mentioned nonvolatile memory device, at least one of the following effects may be obtained. The heat sink pattern may prevent or reduce joule heat, which is generated from a variable resistance memory cell to be written, from being transferred to adjacent variable resistance memory cells. For example, the heat sink pattern may have a thermal conductivity larger than the variable resistance patterns. For this reason, the joule heat, which may be transferred to the adjacent variable resistance memory cells, may be transferred to the heat sink pattern and then radiated to the outside through a ground voltage line. Accordingly, the nonvolatile memory device using the heat sink pattern may be highly integrated.

What is claimed is:

1. A nonvolatile memory device comprising:
a semiconductor substrate;
a plurality of variable resistance patterns on the semiconductor substrate;
a ground voltage line on the semiconductor substrate;
a heat sink pattern having a top surface substantially level with the variable resistance patterns and a bottom surface on the ground voltage line;
a first dielectric film; and
a second dielectric film on the first dielectric film, wherein the ground voltage line is on the first dielectric film and the plurality of variable resistance patterns are on the second dielectric film and the heat sink pattern extends through the first and second dielectric films to contact the ground voltage line, wherein a width of the ground voltage line is greater than a width of the heat sink pattern.

2. The nonvolatile memory device of claim 1, wherein the ground voltage line extends in a first direction.

3. The nonvolatile memory device of claim 2, wherein the heat sink pattern extends in the first direction.

4. The nonvolatile memory device of claim 2, wherein the heat sink pattern includes a first sub-heat sink pattern and a second sub-heat sink pattern, the first sub-heat sink pattern being on the ground voltage line and extending in the first direction, and the second sub-heat sink pattern extending in a second direction so as to cross the first direction.

5. The nonvolatile memory device of claim 2, wherein the heat sink pattern includes a plurality of sub-heat sink patterns on the ground voltage line, the plurality of sub-heat sink patterns being spaced apart from each other in the first direction.

6. The nonvolatile memory device of claim 2, further comprising:
a spacer defining a width of the heat sink pattern.

7. The nonvolatile memory device of claim 1, wherein the plurality of variable resistance patterns are separately formed in memory cells.

8. The nonvolatile memory device of claim 1, wherein the heat sink pattern directly contacts the ground voltage line.

9. The nonvolatile memory device of claim 8, wherein an uppermost surface of the ground voltage line is below a lowermost surface of the variable resistance patterns.

10. The nonvolatile memory device of claim 1, wherein the heat sink pattern and the ground voltage line include aluminum.

11. A nonvolatile memory device comprising:
a semiconductor substrate;
first and second access transistors including first and second gate electrodes and first and second and third junction regions, the gate electrodes being on the semiconductor substrate, and the first and second and third junction regions being in the semiconductor substrate, the first gate electrode being between the first junction region and the second junction region and the second gate electrode being between the first junction region and the third junction region;

a ground voltage line coupled to the first junction region;

variable resistance patterns coupled to the second and third junction regions;

a heat sink pattern on the ground voltage line, the heat sink pattern being adjacent to the variable resistance patterns, the heat sink pattern having a top surface substantially level with the variable resistance patterns and a bottom surface on the ground voltage line;

a first dielectric film; and a second dielectric film on the first dielectric film, wherein the ground voltage line is on the first dielectric film and the variable resistance patterns are on the second dielectric film and the heat sink pattern extends through the first and second dielectric films to contact the ground voltage line, wherein a width of the ground voltage line is greater than a width of the heat sink pattern.

12. The nonvolatile memory device of claim 11, wherein the ground voltage line extends in a first direction.

13. The nonvolatile memory device of claim 12, wherein the heat sink pattern extends in the first direction.

14. The nonvolatile memory device of claim 12, wherein the heat sink pattern includes a first sub-heat sink pattern and a second sub-heat sink pattern, the first sub-heat sink pattern being on the ground voltage line and extending in the first direction, and the second sub-heat sink pattern extending in a second direction so as to cross the first direction.

15. The nonvolatile memory device of claim 12, wherein the heat sink pattern includes a plurality of sub-heat sink patterns on the ground voltage line, the plurality of sub-heat sink patterns being spaced apart from each other in the first direction.

16. The nonvolatile memory device of claim 12, further comprising:

a spacer defining a width of the heat sink pattern.

17. The nonvolatile memory device of claim 11, further comprising:

landing pads between the second and third junction regions and the variable resistance patterns so as to be level with the ground voltage line.

18. The nonvolatile memory device of claim 17, further comprising:

bottom electrode contacts between the landing pads and the variable resistance patterns.

19. The nonvolatile memory device of claim 11, wherein the plurality of variable resistance patterns are separately formed in memory cells.

20. A nonvolatile memory device comprising:

a semiconductor substrate;

first and second access transistors including:

first and second gate electrodes on the semiconductor substrate to extend in a first direction, a first junction region in the semiconductor substrate between the first and second gate electrodes, a second junction region in one side of the first gate electrode opposite to the first junction region, and a third junction region in one side of the second gate electrode opposite to the first junction region;

a ground voltage line coupled to the first junction region, the ground voltage line extending in the first direction;

first and second variable resistance patterns coupled to the second and third junction regions, respectively;

a heat sink pattern coupled to the ground voltage line, the heat sink pattern being between the first and second variable resistance patterns so as to extend in the first direction, the heat sink pattern having a top surface substantially level with the variable resistance patterns and a bottom surface on the ground voltage line;

a first dielectric film; and a second dielectric film on the first dielectric film, wherein the ground voltage line is on the first dielectric film and the first and second variable resistance patterns are on the second dielectric film and the heat sink pattern extends through the first and second dielectric films to contact the ground voltage line, wherein a width of the ground voltage line is greater than a width of the heat sink pattern.

21. The nonvolatile memory device of claim 20, wherein the heat sink pattern is level with at least one of the first variable resistance pattern and the second variable resistance pattern.

* * * * *